United States Patent [19]

Ulmer, Jr. et al.

[11] Patent Number: 5,124,634

[45] Date of Patent: Jun. 23, 1992

[54] RING OPTICAL CURRENT TRANSDUCER

[75] Inventors: Edward A. Ulmer, Jr., Clearwater; Thomas J. Meyer, Pinellas Park, both of Fla.

[73] Assignee: Square D Company, Palatine, Ill.

[21] Appl. No.: 514,197

[22] Filed: Apr. 25, 1990

Related U.S. Application Data

[63] Continuation-in-part of Ser. No. 323,599, Mar. 14, 1989.

[51] Int. Cl.$^5$ .............................................. G01R 19/00
[52] U.S. Cl. ..................... 324/96; 324/72.5; 324/117 R
[58] Field of Search ............ 324/72.5, 96, 117 R, 324/244.1; 250/225, 227.28, 227.32; 350/374–376

[56] References Cited

U.S. PATENT DOCUMENTS

| | | | |
|---|---|---|---|
| 3,324,393 | 6/1967 | Casey et al. | 324/96 |
| 3,360,323 | 12/1967 | Weisman et al. | 350/151 |
| 3,597,683 | 8/1971 | Saito | 324/96 |
| 3,605,013 | 9/1971 | Yoshikawa et al. | 324/96 |
| 3,609,381 | 9/1971 | Hartfield | 250/225 |
| 3,621,390 | 11/1971 | Von Willisen | 324/96 |
| 3,629,703 | 12/1971 | Bernard | 324/96 |
| 3,679,974 | 7/1972 | Mollenbeck | 324/96 |
| 3,693,082 | 9/1972 | Jaecklin | 324/96 |
| 3,705,395 | 12/1972 | Aagard et al. | 340/174 YC |
| 3,707,321 | 12/1972 | Jaecklin et al. | 350/151 |
| 3,707,329 | 12/1972 | Jaecklin et al. | 356/117 |
| 3,708,747 | 1/1973 | Leseur | 324/96 |
| 3,711,264 | 1/1973 | Robinson et al. | 65/134 |
| 3,743,929 | 7/1973 | Lesueur | 324/96 |
| 3,746,983 | 7/1973 | Renz | 324/96 |
| 3,753,101 | 8/1973 | Aumont | 324/96 |
| 3,754,143 | 8/1973 | Lesueur | 250/204 |
| 3,769,584 | 10/1973 | Iten et al. | 324/96 |
| 3,778,619 | 12/1973 | Carnel | 250/225 |
| 3,781,092 | 12/1973 | Sussman et al. | 350/266 |
| 3,906,343 | 9/1975 | Feldtkeller | 324/96 |
| 3,936,742 | 2/1976 | Krause | 324/96 |
| 3,944,329 | 3/1976 | Lee, Jr. et al. | 350/151 |
| 3,947,089 | 3/1976 | Rapp | 350/151 |
| 3,980,949 | 9/1976 | Feldtkeller | 324/96 |
| 4,002,975 | 1/1977 | Erickson et al. | 324/96 |
| 4,035,083 | 7/1977 | Woodriff et al. | 356/115 |
| 4,070,620 | 1/1978 | Feldtkeller et al. | 324/96 |
| 4,070,622 | 1/1978 | Harms et al. | 324/96 |
| 4,117,399 | 9/1978 | Ono et al. | 324/96 |
| 4,232,264 | 11/1980 | Papp et al. | 324/96 |
| 4,243,936 | 1/1981 | Papp et al. | 324/96 |
| 4,253,061 | 2/1981 | Ono et al. | 324/96 |
| 4,255,018 | 3/1981 | Ulrich et al. | 350/375 |
| 4,272,158 | 6/1981 | Johnston, Jr. et al. | 350/375 |
| 4,272,159 | 6/1981 | Matsumoto | 350/375 |
| 4,298,245 | 11/1981 | Aulich et al. | 350/96 |
| 4,363,061 | 12/1982 | Vaerewyck et al. | 361/31 |
| 4,370,612 | 1/1983 | Puech et al. | 324/117 |
| 4,392,722 | 7/1983 | Shirasaki | 350/375 |
| 4,428,017 | 1/1984 | Vaerewyck et al. | 361/31 |
| 4,531,092 | 7/1985 | Shibano | 324/244 |
| 4,539,519 | 9/1985 | Ulrich et al. | 324/117 |
| 4,539,521 | 9/1985 | Matsumoto | 324/244 |

(List continued on next page.)

OTHER PUBLICATIONS

"Fine Annealing of Optical Glass for Low Residual Stress and Refractive Index Homogeneity" by H. E. Hagy, Applied Optics May 1968, vol. 7, No. 5.

(List continued on next page.)

Primary Examiner—Kenneth A. Wieder
Assistant Examiner—William J. Burns
Attorney, Agent, or Firm—Michael J. Femal; Hugh M. Gilroy

[57] ABSTRACT

An optical current transducer for measuring current in a high voltage transmission line includes a temperature compensated light source of nominal predetermined intensity and wavelength, a Faraday rotation device where Faraday rotation impressed on the light exiting the light source is proportional to the intensity of the electrical current to be measured. A hermetic tank encloses the Faraday rotation device to provide protection from the environment. An electronic circuit converts the optical output of the Faraday rotation device to an electrical signal in direct proportion to and in phase with the current to be measured.

16 Claims, 11 Drawing Sheets

U.S. PATENT DOCUMENTS

| | | | |
|---|---|---|---|
| 4,540,937 | 9/1985 | Asars | 324/96 |
| 4,554,419 | 11/1985 | Taniuchi et al. | 250/227 |
| 4,560,932 | 12/1985 | Mitsui et al. | 324/244 |
| 4,563,639 | 1/1986 | Langeac | 324/96 |
| 4,563,646 | 1/1986 | De'sormie're | 324/244 |
| 4,564,754 | 1/1986 | Sato et al. | 250/225 |
| 4,578,639 | 3/1986 | Miller | 324/96 |
| 4,581,579 | 4/1986 | Nagatsuma et al. | 324/244 |
| 4,584,470 | 4/1986 | Iizuka et al. | 250/231 |
| 4,604,577 | 8/1986 | Matsumura et al. | 324/244 |
| 4,608,535 | 8/1986 | Tada et al. | 324/244 |
| 4,612,500 | 9/1986 | Chen et al. | 324/96 |
| 4,613,811 | 9/1986 | Vaerewyck et al. | 324/96 |
| 4,615,582 | 10/1986 | Lefevre et al. | 350/96.29 |
| 4,630,218 | 12/1986 | Hurley | 364/481 |
| 4,683,421 | 7/1987 | Miller et al. | 324/96 |
| 4,694,243 | 9/1987 | Miller et al. | 324/96 |
| 4,698,497 | 10/1987 | Miller et al. | 250/231 R |
| 4,745,357 | 5/1988 | Miller | 324/96 |
| 4,755,665 | 7/1988 | Ulmer, Jr. et al. | 250/214 R |
| 4,822,150 | 4/1989 | Duarte | 350/394 |
| 4,956,607 | 9/1990 | Abe et al. | 324/244.1 |

OTHER PUBLICATIONS

"An Absolute Electric Current Probe Based on the Faraday Effect" by Caton et al., Journal of Research May–Jun. 1984, vol. 89.

"The Design of Passive Current Sensors Using Magneto-Optics" by D. C. Erickson, Div. of Substation & Control Eng., Bonneville Power Admin., Dec. 1983.

"Measurement of Faraday Rotation in Twisted Optical Fiber Using Rotating Polarization and Analog Phase Detection" by G. I. Chandler et al., SPIE vol. 566, Fiber Optic and Laser Sensors III (1985), pp. 206–211.

"Optical-Fiber Copolymer-Film Electric-Field Sensor", by M. D. Mermelstein, Applied Optics vol. 22, No. 7/1 Apr. 1983.

"Characteristic Directions in Optics of Twisted Birefringent Media" by H. K. Aben, Journal of the Optical Society of America, A/vol. 3, No. 9, Sep. 1986, pp. 1414–1421.

"Optical Methods for Measurement of Voltage and Current on Power Systems", by A. J. Rogers, Optics and Laser Technology, Dec. 1977.

"Faraday Effect Sensors: The State of the Art," by G. W. Day and A. H. Rose, National Bureau of Standards, 1988.

"High Accuracy Faraday Rotation Measurements," by Ulmer, Paper No. ThCC 21, pp. 288–291, 1988 Technical Digest of Optical Fiber Sensors, New Orleans, La., Jan. 1988.

"Principles of Optics", Pergamon Press, Sixth Edition, 1985, pp. 665667, 703–708, by Born et al.

Measurements by Faraday Rotation in Single-Mode Optical Fiber", by G. Chandler & F. Jahoda, Rev. Sci. Instrum. 56(5), May 1985, pp. 852–854.

"Magneto-Optic Rotation in Birefringement Media—Application of the Poincaré Sphere", By G. Ramachandran & S. Ramaseshan, Journal of the Optical Society of America, vol. 42, No. 1, Jan. 1952, pp. 49–56.

"Calibrated Faraday Current and Magnetic Field Sensor", by B. Neyer, J. Chang, L. Ruggles, SPIE vol. 566, Fiber Optic and Laser Sensors 111 (1985) pp. 201–205.

RING OPTICAL CURRENT TRANSDUCER

BACKGROUND OF THE INVENTION

This application is a continuation-in-part application from U.S. patent application Ser. No. 07/323,599, filed by E. Ulmer, Jr. on Mar. 14, 1989 for a METHOD OF ELIMINATING THE EFFECTS OF BIREFRINGENCE FROM THE DETECTION OF ELECTRIC CURRENT USING FARADAY ROTATION.

This invention relates to the use of a Faraday effect device to measure current in a high-voltage transmission line. In particular, this invention relates to the use of a Faraday effect produced in a body which surrounds the conductor carrying the current to be measured and associated circuitry.

There is a relatively voluminous body of literature including patents and publications dealing with the use of the Faraday effect in devices to measure current, the circuitry associated with the optical portions of the devices, or the optical components employed in such devices. This literature includes the following.

U.S. Pat. No. 3,707,321 issued to Jaecklin et al. on Dec. 26, 1972 describing a MAGNETO-OPTICAL PROBE HAVING NATURAL BIREFRINGENCE ERROR COMPENSATION.

U.S. Pat. No. 4,070,620 issued to Feldtkeller et al. on Jan. 24, 1978 describing a MAGNETO-OPTICAL HIGH-VOLTAGE CURRENT MEASURING TRANSDUCER.

U.S. Pat. No. 4,428,017 issued to Vaerewyck et al. on Jan. 24, 1984 describing an ELECTRIC MOTOR AND TRANSFORMER LOAD SENSING TECHNIQUE.

U.S. Pat. No. 4,612,500 issued to Chen et al on Sept. 16, 1986 describing TEMPERATURE STABILIZED FARADAY ROTATOR CURRENT SENSOR BY THERMAL MECHANICAL MEANS.

U.S. Pat. No. 4,613,811 issued to Vaerewyck et al. on Sept. 23, 1986 describing a FARADAY CURRENT SENSOR WITH FIBER OPTIC COMPENSATED TEMPERATURE DEGRADATION AND LINEARITY.

U.S. Pat. No. 4,564,754 issued to Sato et al. on Jan. 14, 1986 describing a METHOD AND APPARATUS FOR OPTICALLY MEASURING A CURRENT.

U.S. Pat. No. 4,745,357 to Miller on May 17, 1988 describing an OPTICAL INTERFACE FOR A MAGNETO-OPTICAL CURRENT TRANSDUCER. :

U.S. Pat. No. 4,755,665 to Ulmer, Jr. et al on July 5, 1988 describing a LIGHT DETECTOR AND SIGNAL PROCESSING CIRCUIT.

U.S. Pat. No. 4,822,150 to Duarte on Apr. 18, 1989 describing an OPTICAL DEVICE FOR ROTATING THE POLARIZATION OF A LIGHT BEAM.

*An Absolute Electric Current Probe Based on the Faraday Effect*, by H. E. Hagy, JOURNAL OF RESEARCH May-June 1984.

*Fine Annealing of Optical Glass for Low Residual Stress and Refractive Index Homogeneity*, by W. Caton et al., APPLIED OPTICS May 1968.

It is not believed that the foregoing or the prior art teaches a Faraday effect device which is capable of measuring transmission line currents with the precision and stability of the present invention of a ring optical current transducer. The present ring optical current transducer includes optical and electronic components to measure current in an transmission line. The optical components include a optical bench upon which foul annealed glass bars are mounted. The glass bars surround the conductor carrying the current to be measured. A light source supplies reference light of a nominal predetermined intensity, which is polarized and transmitted to a first light bar. Each light bar is optically coupled to an adjoining light bar by means of two reflective surfaces. The sum of the reflections about the ring should be even and the length of the glass between reflections should be equal. The output from the last glass bar is coupled to a second polarizer called an analyzer from which the rotated light is coupled to a light activated device. The light activated device provides a light electrical signal to associated electrical circuitry. The associated electronic circuitry includes an are side converter and provides an electrical signal proportionate to the transmission line current.

DETAILED DESCRIPTION

Figure 1:
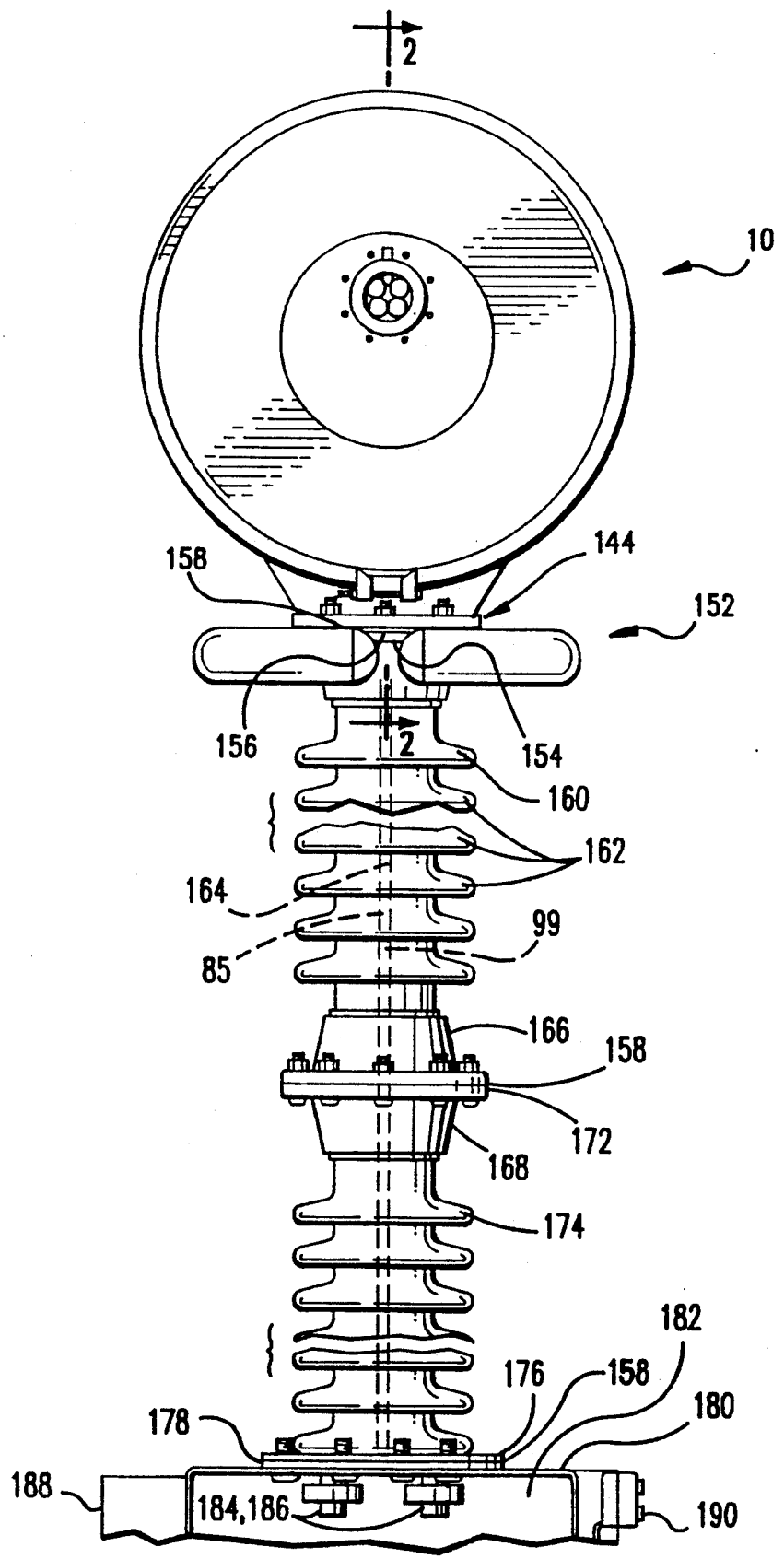
FIG. 1 is a front elevation of the optical current transducer of the present invention.

FIG. 1 shows the optical current transducer 10, suitable for use in a 230K volt transmission line, in plan view. The optical current transducer 10 provides a light output which is proportional to the magnitude of the current in a transmission line to which the optical current transducer 10 is connected. The optical current transducer 10 with associated circuitry can be used as a current measuring device.

Figure 3:
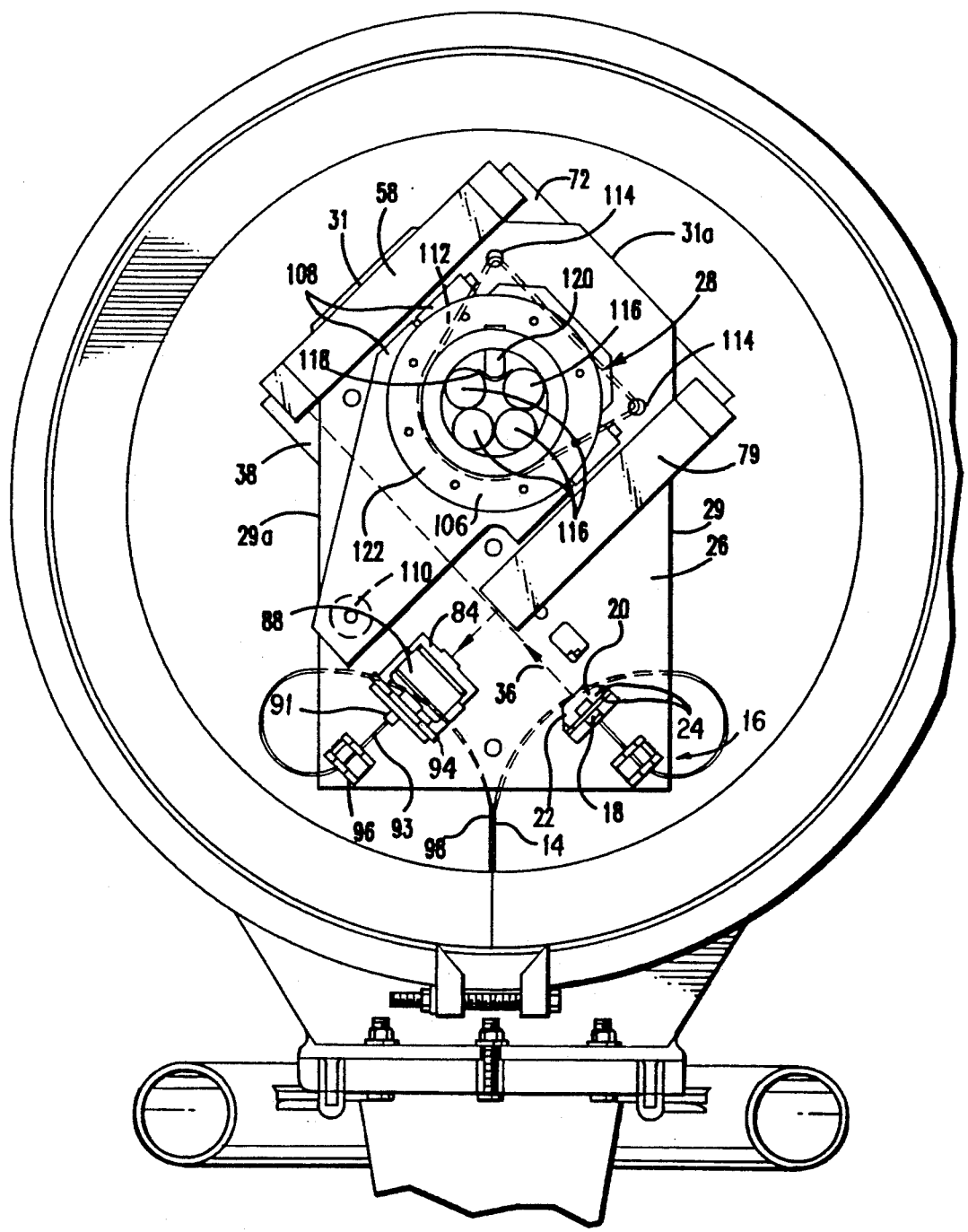
FIG. 3 is front sectional view of the transducer head.

The optical current transducer 10 works on the principle of Faraday rotation. Faraday rotation is the effect shown by certain media wherein when a medium of the correct type is immersed in a magnetic field and polarized light is propagated through the medium in the same direction as the applied magnetic lines at force, the polarization vector of the light will be rotated away from its original direction by an amount proportional to the intensity of the applied magnetic field. A light source 500 which, in the preferred embodiment is an LED, produces unpolarized light of a nominally predetermined intensity and wavelength, which is conveyed by an input light fiber 14 through a coupling 1 to a polarizer assembly (shown in FIG. 3).

The polarizer assembly includes an optical fiber connector 18, an achromatic collimating lens 20 and a polarizer of fixed angle 22. These optical components 18-22 are being held fixed in a mount 24. The mount 24 is being bonded to a non-conductive semi-octagonal planar optical bench 26 which defines a bench orifice 28, has first and second bench mounting surfaces 30 & 32, and parallel sides 29 and 29a and corner 31 sides 31 and 31a.

Linearly polarized collimated light exits the polarizer 22 and impinges upon a planar input end surface 4, oriented 90 degrees to the transmission axis 36, of a first Faraday rotating glass bar 38. The bar being of a light transmitting flint glass, having a non-zero Verdet constant. The preferred glass being Shott glass SF-15.

Ideally, each bar should be perfectly isotropic and free of all mechanical stresses but present optical technology does not as yet have a way of producing a bar with such qualities.

Stresses within the bar produce birefringent distortion of the beam and thereby introduce error into the Faraday rotation measurement.

Figure 7:
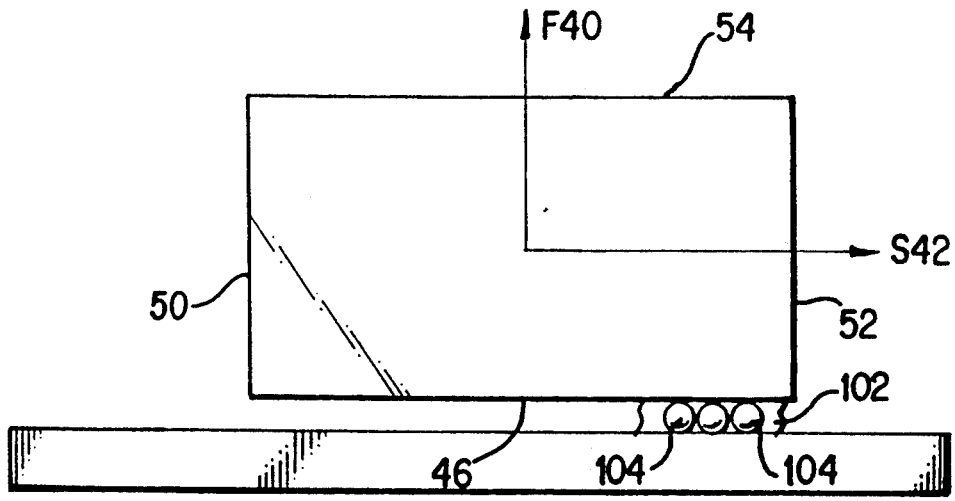
FIG. 7 is a sectional view of one of the glass bars mounted upon an optical bench employed in the present invention.
Figure 8:
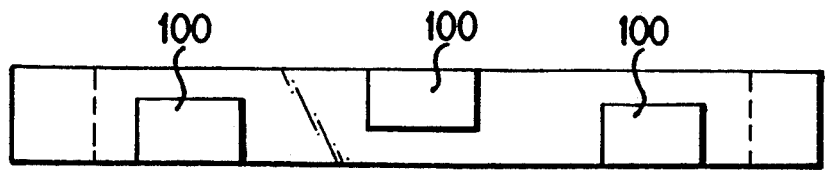
FIG. 8 is a representative view of the location of bonds between a glass bar and an optical bench.

To alleviate the effects of birefringence in this device, each bar is prestressed to provide two well-characterized orthogonal stress axes 40, 42 as shown in FIG. 7. These axes are created in the bar by annealing the bar at two differing rates along the two axes normal to the sides of the bar and transverse to the transmission axis of the bar. The axial designations of fast 40 and slow 42 being descriptive of the fact that the velocity o propagation along the fast axis is faster than along the slow axis.

The bar also has a bench surface 46 and an output end surface 48 which is oriented 45 degrees to the transmission axis 36. The output end surface connecting the two side surfaces 50, 52, a bench surface 46 and a distal surface 54, this extension of the end surface to all four sides of its associated bar being true for all end surfaces.

A system of bars making up the Faraday rotator is subject to the following conditions: (A) the rotator must surround the current to be measured and (B) to greatly reduce birefringence the path length of a component of the electric vector along one stress axis must be equal to the path length of the same component along the other stress axis.

Figure 4:
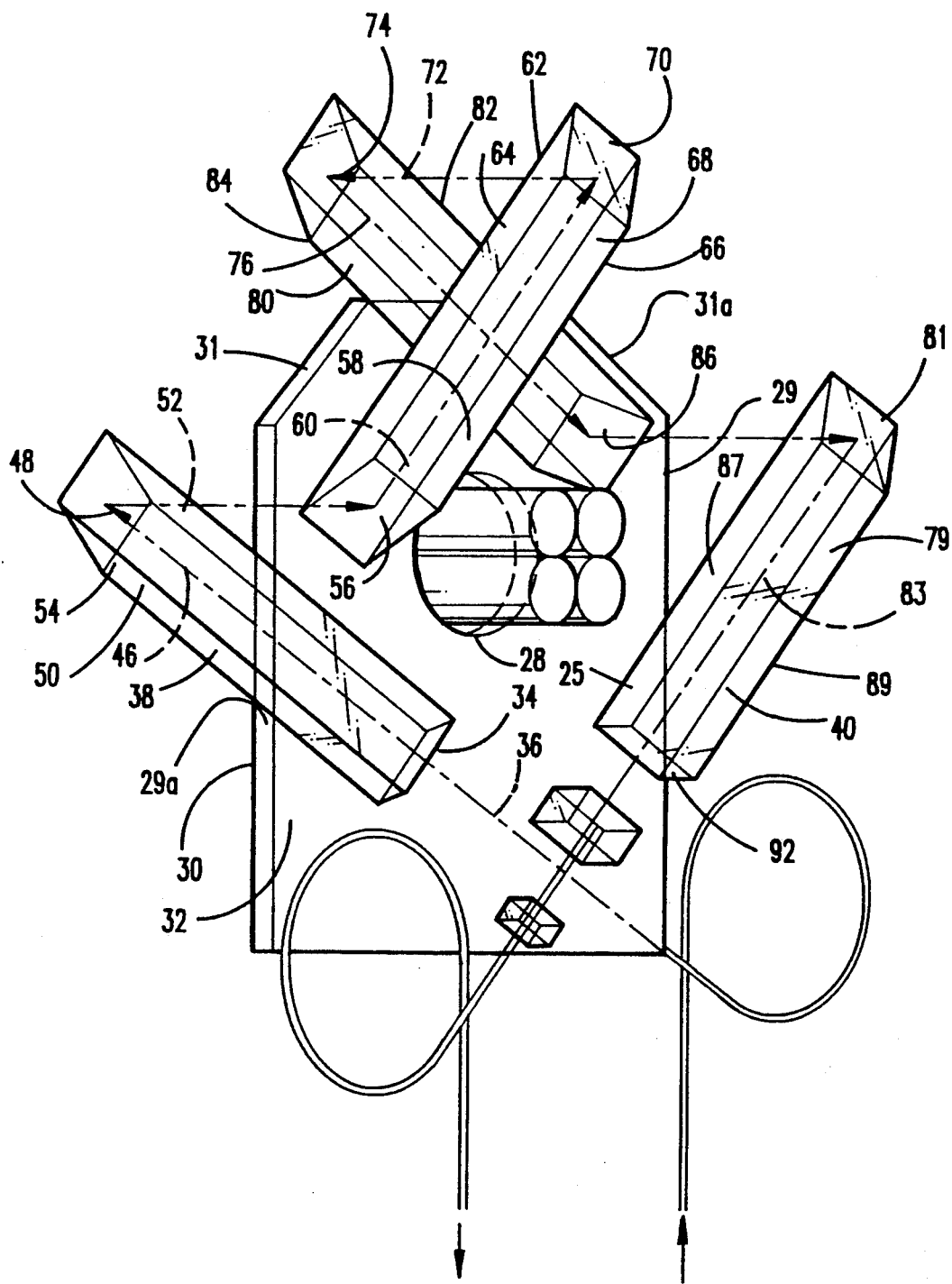
FIG. 4 is a partially exploded illustrated schematic of the operative components of the transducer head.
Figure 5:
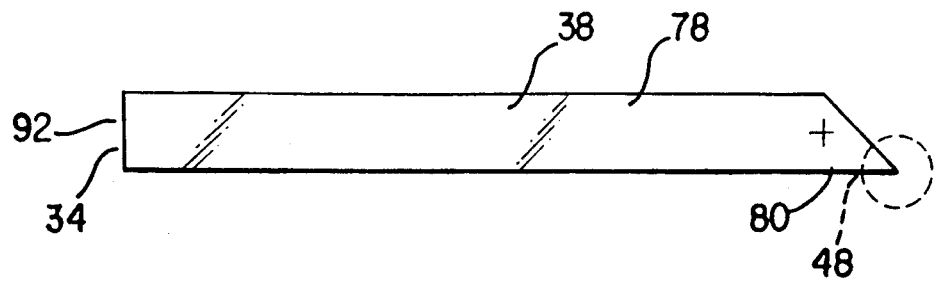
FIG. 5 is a side elevation of a first type of glass bar employed in the present invention.
Figure 6:
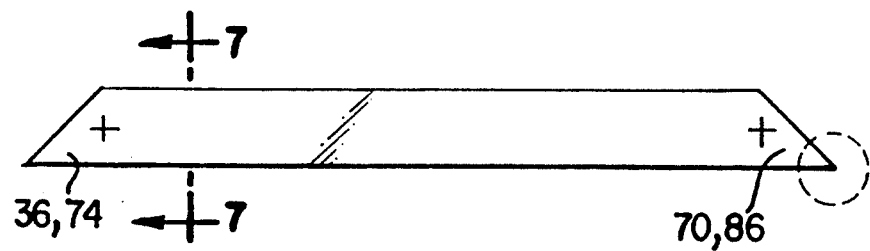
FIG. 6 is a side elevation of a second type of glass bar employed in the present invention.

These conditions are satisfied, as shown in FIG. 4, by placing four bars in a toroidal configuration enclosing the bench orifice 28 with the output end of the first bar 48 being rotated 90 degrees to the input end 56 of the second bar 58, the input end being at a 45 degree angle with the transmission axis 60 of the second bar 58. The two reflections oriented thusly rotate the polarization of the input light by 90 degrees relative to the output of the first bar. This rotation interchanges the propagation direction along which any vector component propagates relative to the stress axis to the preceding bar.

The second bar contains a bench surface 62, two side surfaces 64,66, a distal surface 68, and a planar output surface 70, which is oriented by an output angle of 45 degrees to the transmission axis 60 of the second bar 58.

A third glass bar 72 receives light from its associated component and has an input end generally planar surface 74 oriented degrees to the transmission axis of the third bar 76 and rotated 90 degrees relative to the second bar 58. The third bar contains a bench surface 78, two side surfaces 80, 82, a distal surface 84 and a generally planar output end surface 86 which is oriented 45 degrees to the transmission axis of the third bar 76.

A fourth glass bar 79 receives light from its associated component and contains an input end surface 81 oriented 45 degrees to the transmission axis 83 of the fourth bar, and which is rotated 90 degrees relative to the third bar 72.

The fourth bar contains a bench surface 85, two side surfaces 87, 89, a distal surface 90 and a generally planar output surface (92) oriented 90 degrees to the transmission axis of the fourth bar 83.

Returning to FIG. 3, upon exiting the fourth bar, the Faraday rotated light beam enters a second polarizer called an analyzer 84, which is oriented perpendicular to the direction of light propagation, and whose polarization axis is rotated by 45 degrees relative to the input polarizer 22.

Following the analyzer is a focussing lens 88 and an optical fiber connection 91 to an output fiber 93. The analyzer components 84, 93 are affixed to the bench via a mount 94 which is bonded to the bench by means of a polymer fixative such as SCOTCH-WELD No. 2216 B/A made by 3M of St. Paul, Mn. epoxy.

The output fiber is then connected via a coupler 96, affixed to the bench, to an output light fiber 98, which leads away to the measuring circuitry. The glass bars are semi-rigidly mounted to the optical bench via mounts 100 composed of a binding medium 102, such as the above epoxy, and a single row of glass-bearing spheres 104, such as BALINTINA SPHERES made by Precomp of Great Neck, N.Y., interspersed therein. This mounting means allowing flexibility while fixing the minimum distance between the bar and its associated mounting surface. As shown in FIG. 4, the first bar 38 and third bar 72 are mounted with their lengthwise side surfaces parallel to one corner side 31a of the bench 26. The second bar 58 and fourth bar 79 bar are aligned with their lengthwise side surfaces parallel to the other corner side 31. The output end surfaces 48, 56, 70, 74, 86 and 81 of bars 38, 58, 72 and 79 extend beyond the sides of the optical bench. The bars are mounted so as to alternate between the two bench mounting surfaces 30,32, to the effect of having the first and third bars on the first bench mounting surface 30, and the second and fourth bars on the second mounting surface 32.

The optical bench is affixed to a bench insulative pipe 106 via a two piece non-conductive mount 108, the mount being stress isolated by a set of compliant washers 110, and a safety wire 112 which passes around the insulative pipe 106 and passes through a plurality of provided holes 114 in the optical bench.

Interior to the bench insulative pipe is an electrical bench conductor 116, consisting of a plurality of cables, to which is associated a bench conductor assembly. The bench conductor assembly comprises a bi-planar pressure plate 118 and a thrust pin 120, the assembly affixing the location of the bench conductor 116 with respect to the bench insulative pipe 106 and, via the two piece non-conductive mount 108 and safety wire 112, affixing the location of the bench conductor 116 relative to the optical bench 26.

Figure 2:
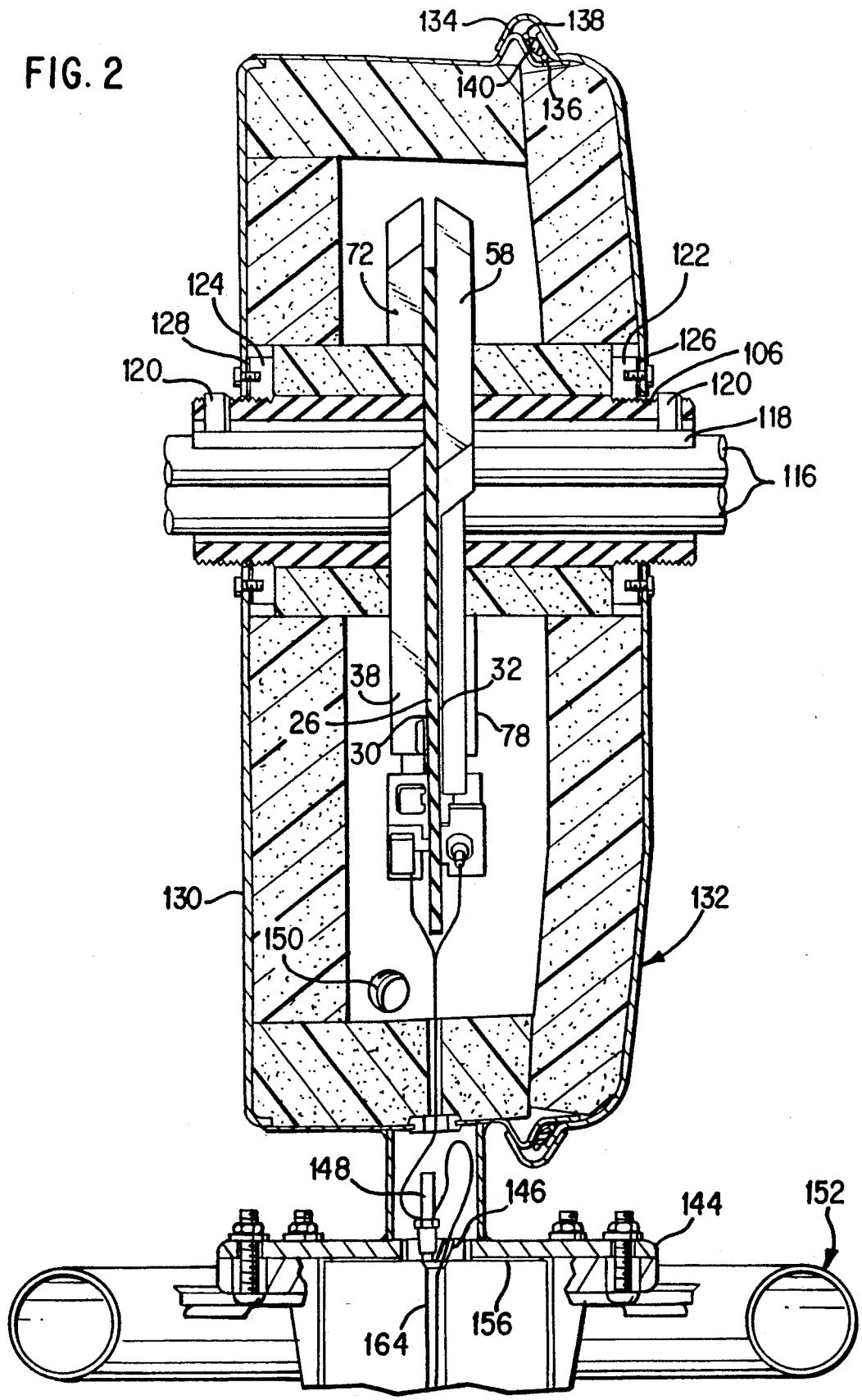
FIG. 2 is a side sectional view of the transducer head.

FIG. 2 shows threaded onto each end of the bench insulative pipe 106 and sealed, by a sealant such as SCOTCH-WELD epoxy, thereto are two flanges 122,124. Each flange provides a mating thread about the interior diameter of the flange and a plurality of longitudinal holes so as to enable the flange to be mounted to its associated part.

By means of threaded fasteners, each flange is connected to its corresponding part of a hermetic tank 130, 132. Placed between each flange and its corresponding part of the tank is an axial O-ring 126, 128, which is provided to create a gas tight seal between each flange and its associated part of the tank, the O-ring being sealed thereto by means of a sealant such as RTV ™.

As shown in FIG. 2, the hermetic tank is made up of a tank body 130, a tank access cap 132, an O-ring compression clasp ring 134, two O-ring retainers 136,138, a sealing O-ring 140, an optical fiber throughport 142, a base flange 144, a base flange fiber throughport 146 and, with access to the base flange throughport, a sealant injection fitting 148 similar to coupler 96. Provision is also made for a pressure sensor connection 150 on the body of the tank.

As shown in FIG. 1, the tank stands on a corona suppression ring 152 which is affixed to the tank base flange 144 by threaded fasteners. This same base flange 144 mates to a corresponding insulator pedestal capital flange 154 and is affixed thereto by the same fasteners connecting the base flange 144 to the corona suppression ring 152. Inserted between the tank base flange and the insulator pedestal capital flange is a sealing O-ring 156, made of a material such as Viton ™, whose sealing action is enhanced by the use of a polymer sealant 158, such as Gasket Maker ™ from Permabond International of Englewood, N.J., applied on and about the ring and flange.

Interior to the insulator pedestal capital flange is the upper insulator pedestal 160. The upper insulator pedestal is composed of an insulating material into which is impressed a plurality of sheds 162. Within the interior of the insulator pedestal is an optical fiber raceway 164 into which is inserted the input fiber 14 and output fiber 98. The raceway is then filled with a non-conductive polymer sealant 99, such as Dow Corning Silicone Gel ™. The sealant is introduced to the raceway via the sealant injection fitting 148. The upper insulator pedestal 160 surmounts an insulator pedestal base flange 166 which in turn is connected by threaded fasteners to the pedestal capital flange 168 of the lower insulator pedestal 170. Placed between the upper pedestal base flange 166 and the lower pedestal capital flange 168 is a silicone sealing O-ring 172 which is also surrounded with a polymer sealant 158. The lower insulator pedestal 170 being substantially similar to the upper pedestal in providing a raceway for the optical fibers and being of an insulating nature so that the combination of upper and lower pedestals provides sufficient creepage distance to prevent a flashover. The lower pedestal is mounted via a base flange 176 which rests upon a silicone sealing O-ring 178 which is surrounded by a polymer sealant 158 to a pedestal base 180. The base 180 contains a fiber junction area 182, a provision for a plurality of optical fiber connectors 184,186, and a means for the optical fibers to exit the base and, via a conduit coupling 188, enter a conduit to remotely mounted measuring circuitry. The pedestal base also contains a plurality of holes 190 arranged about the bottom of the base, to mount the base and its attached assemblies to a foundation or some other surface.

Figure 11:
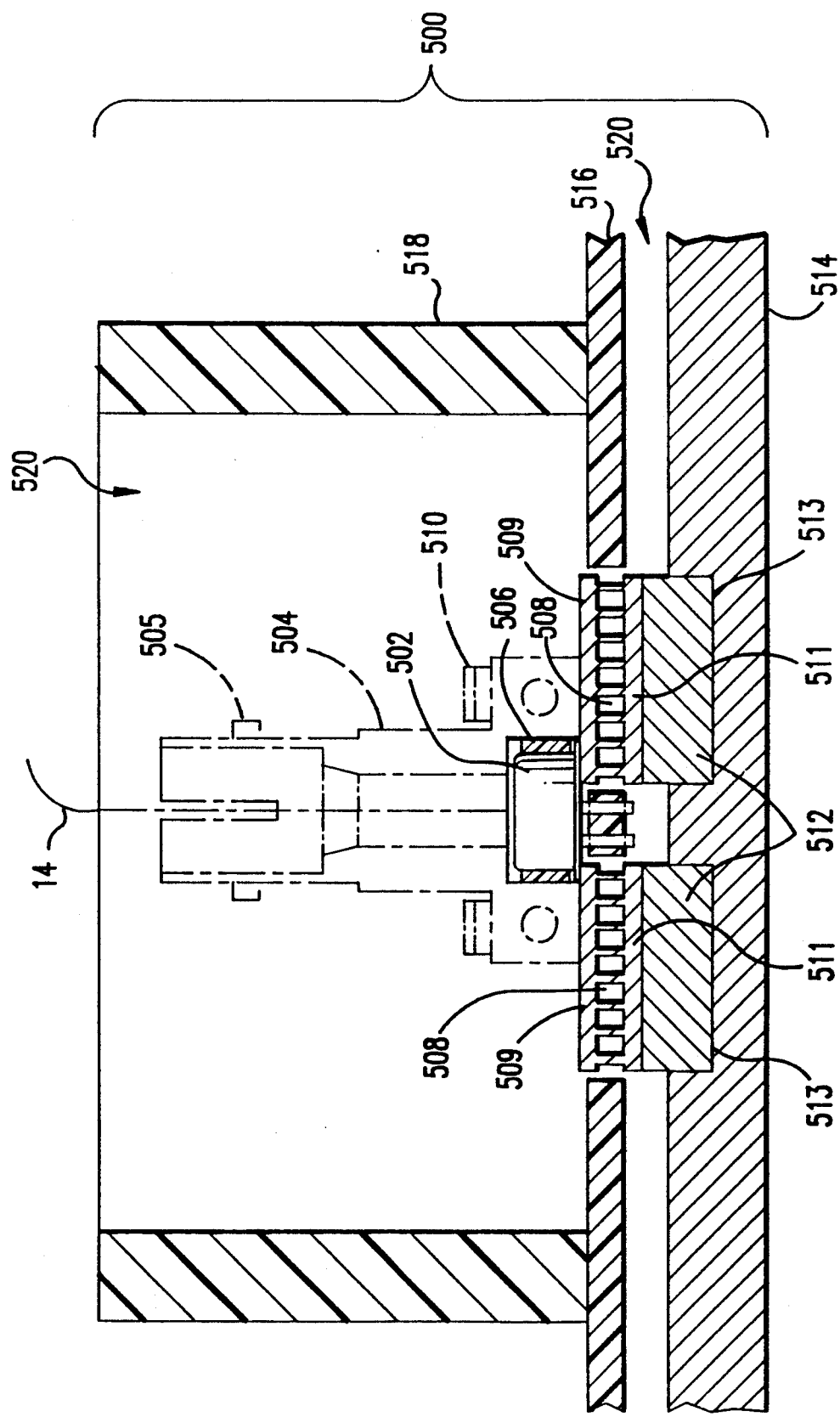
FIG. 11 is a cross-sectional view of a portion of the ring electrical optical current transducer relating to maintaining a constant temperature of light source.

FIG. 11 depicts the light emitting assembly 500. The assembly is optically connected to the input optical fiber 1 of the optical current transducer 10. To ensure an accurate and reproducible Faraday rotation and thereby an accurate current measurement, it is very important that the input light have nominally predetermined intensity and wavelength. These two requirements exist because: first, the component of the output signal which measures the direct current component of the current to be measured is dependent on intensity; and, second, the Verdet constant of the medium, i.e., the Faraday rotation per unit length and magnetic field, is a function of the input wavelength.

It is a property of LED's that the output wavelength of an LED changes as its temperature changes. To ensure uniform output wavelength in this embodiment, the LED's temperature is actively controlled.

The light-emitting assembly consists of a light-emitting diode (LED) 502, such as Motorola MFOE-1102, which is optically coupled to the optical input fiber 14 of the optical current transducer 10.

The LED 502 and optical fiber 14 are placed within an STC style fiber optic device mount 504, which provides mechanical support for the LED 502 and fiber 14 and is also part of temperature control means to fix the operating temperature of the LED 502. Within the mount 504 is a plastic bushing 506, which is located circumferentially about the LED 502. The mount 504 rests upon the cold sides 509 of plurality of thermo-electric coolers (TEC's) 508, such as Marlow Industries MI-1012T.

The TEC's 508 are located so as to be in contact with the periphery of the LED 502 to provide a path for heat conduction therefrom. The mount 504 also rests on the TEC's 508 circumferentially about the LED 502, so as to provide for an equality of temperature between the mount 504 and the LED 502. Additionally, locating the mount 504 as described provides for an additional heat conducting path from the LED 502 to the cold sides 509 of the TEC's 508.

Temperature sensing of the LED 502 and its thermally connected parts is provided by a temperature transducer 510 such as Analog Devices AD-590. The transducer 510 is affixed to the mount 504 and thermally coupled thereto.

The hot side 511 of the TEC's 508 rests upon aluminum spacers 512, which provides a heat escape means from the TEC's. The spacers rest in slots 513, shaped to accept the spacers 512, which are milled in a finned aluminum heat sink 514. Surrounding the TEC's 508 is a printed wiring board 516, which contains all power and control wiring for the electrical components within the assembly 500.

Resting upon the printed wiring board 516 is a collar 518 made of a non-conductive material such as a polyvinylchloride. The collar constrains, within its interior, thermal insulation 520, such as urethane foam, which fills the space surrounding the mount 504. Lockpins 505 are a portion of a connector of the style of connector 96 coupling to input optical fiber 14. Additionally, insulation is injected into the interstices between the printed wiring board 516 and the finned heat sink 514. The arrangement thereby thermally isolates the LED 502 and its associated parts from the external environment.

Figure 12A:
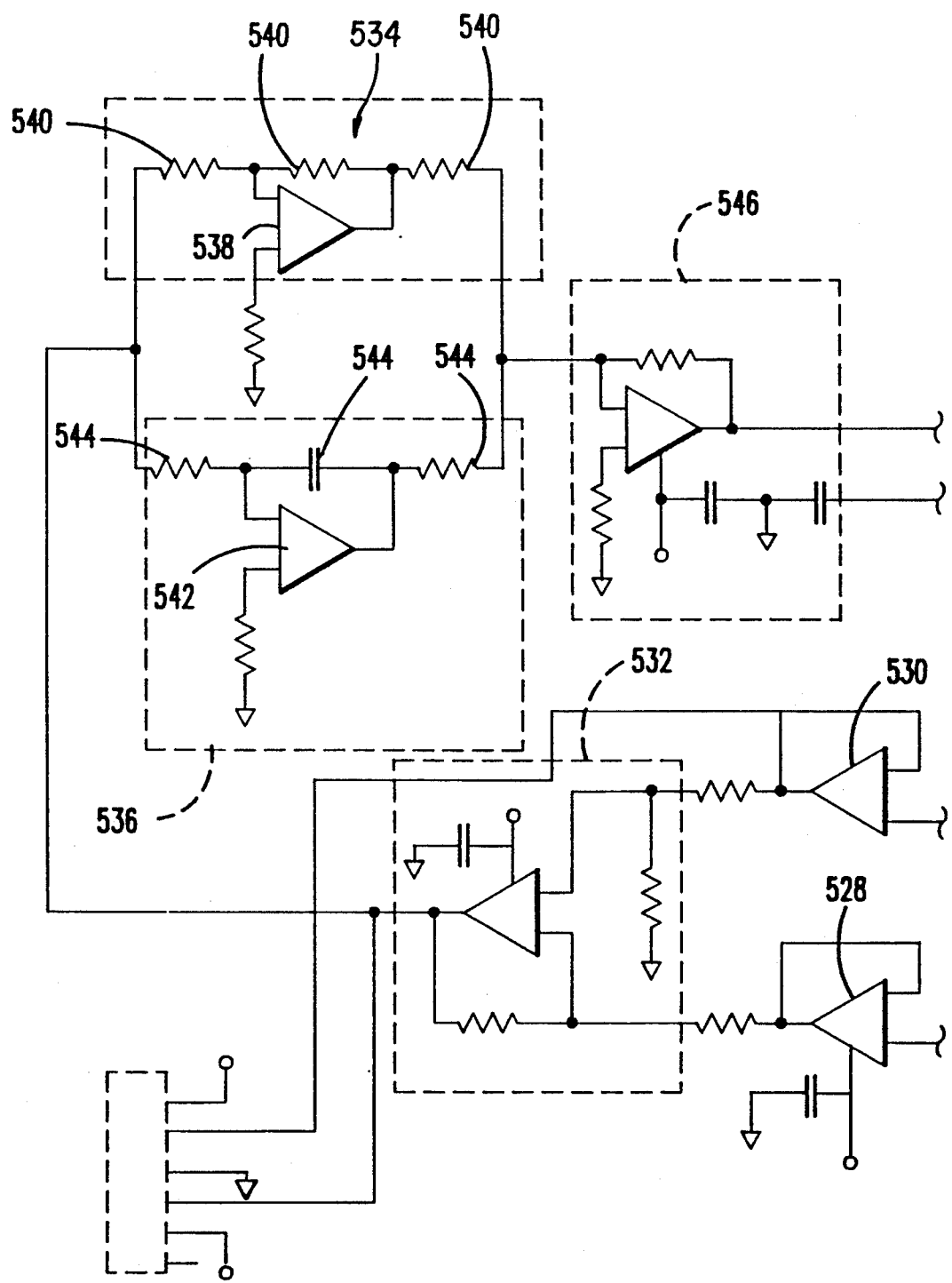
FIG. 12A and FIG. 12B is a schematic of electronic circuitry associated with providing light of a nominal predetermined intensity in the Faraday effect device.
Figure 12B:
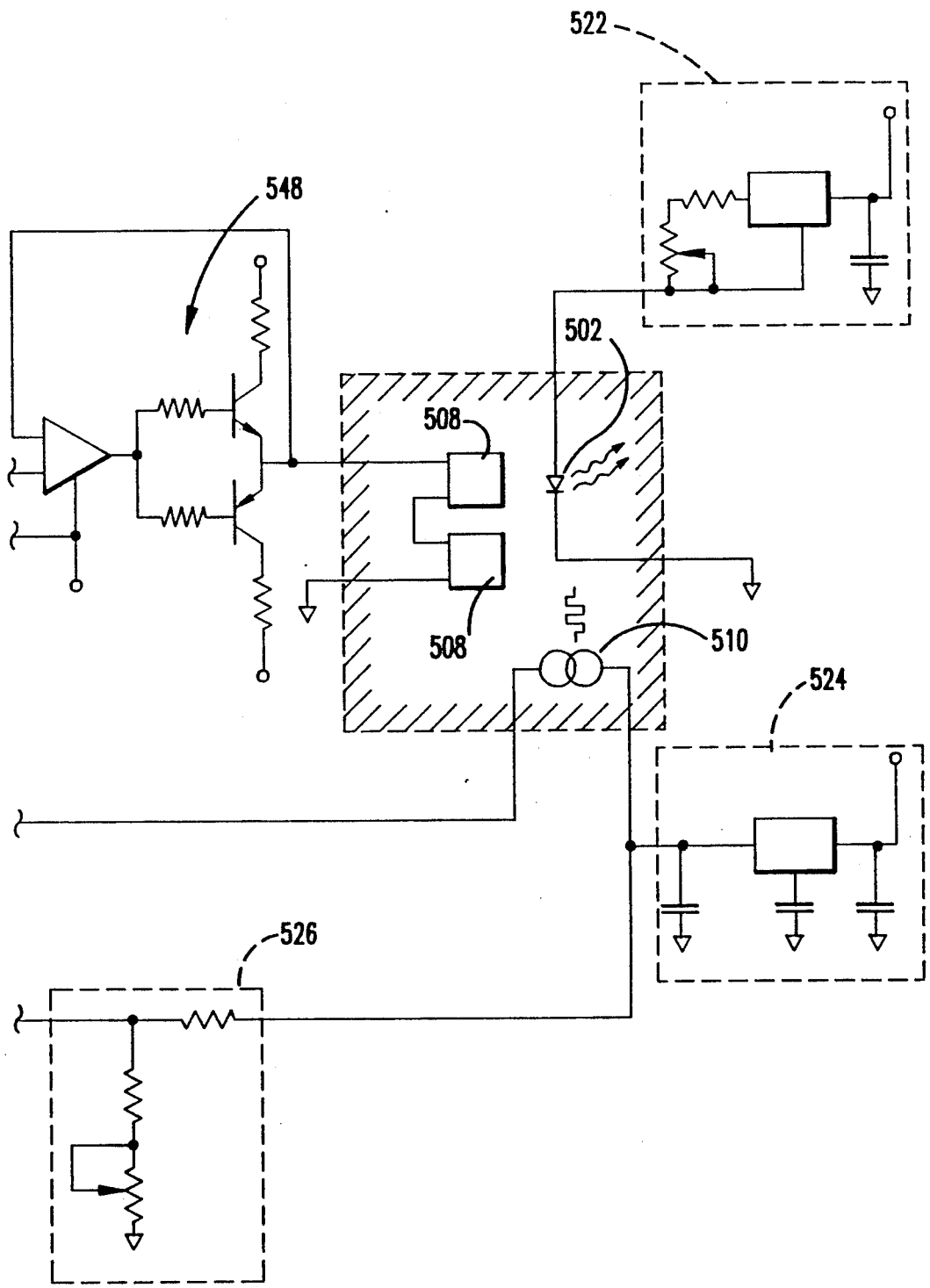

The electronic LED and thermo-electric cooler control circuitry shown in FIG. 12A and FIG. 12B, provide means for powering the LED 502 and automatically fixing its temperature.

The drive circuit for the LED contains a 5-Volt constant voltage regulated power supply 522 which, with its associated components, provide a constant current to the LED 502 so as to ensure a nominally constant intensity of light output.

The temperature control circuit is powered by a separate 5V regulated power supply 524 which drives both the temperature transducer 510 and a reference temperature set point resistance bridge 526. The outputs of both the sensing transducer 510 and the set point resistance bridge 526 then pass through separate buffer amplifiers 528, 530 to a summing circuit 532 which computes the difference between the measured temperature and the fixed set point.

The output of the summing circuit 532, called the error signal, is then introduced to two analyzing circuits 534, 536, the first of which 534 provides an output proportional to the error signal. The function of the proportional circuit 534 is accomplished by use of an amplifier 538 connected in parallel with a series set of resistors 540. The second analyzing circuit 536 provides an output proportional to the time integral of the error signal. This operation is accomplished by use of an amplifier 542 in parallel with a series arrangement 544 of resistors and capacitors. The use of both a proportional term and an integral term provides for more responsive action by the coolers 508 to changing temperature conditions. A second summing circuit 546 adds the proportional signal and the integral signal and inputs the combined signal to a driver circuit 548. The driver circuit 548 is so arranged as to provide sufficient current to drive the TEC's 508 while being controlled by the combined input signal. The driver output connects to a series arrangement of TEC's 508 and exiting therefrom goes to ground, completing the circuit.

Figure 9:
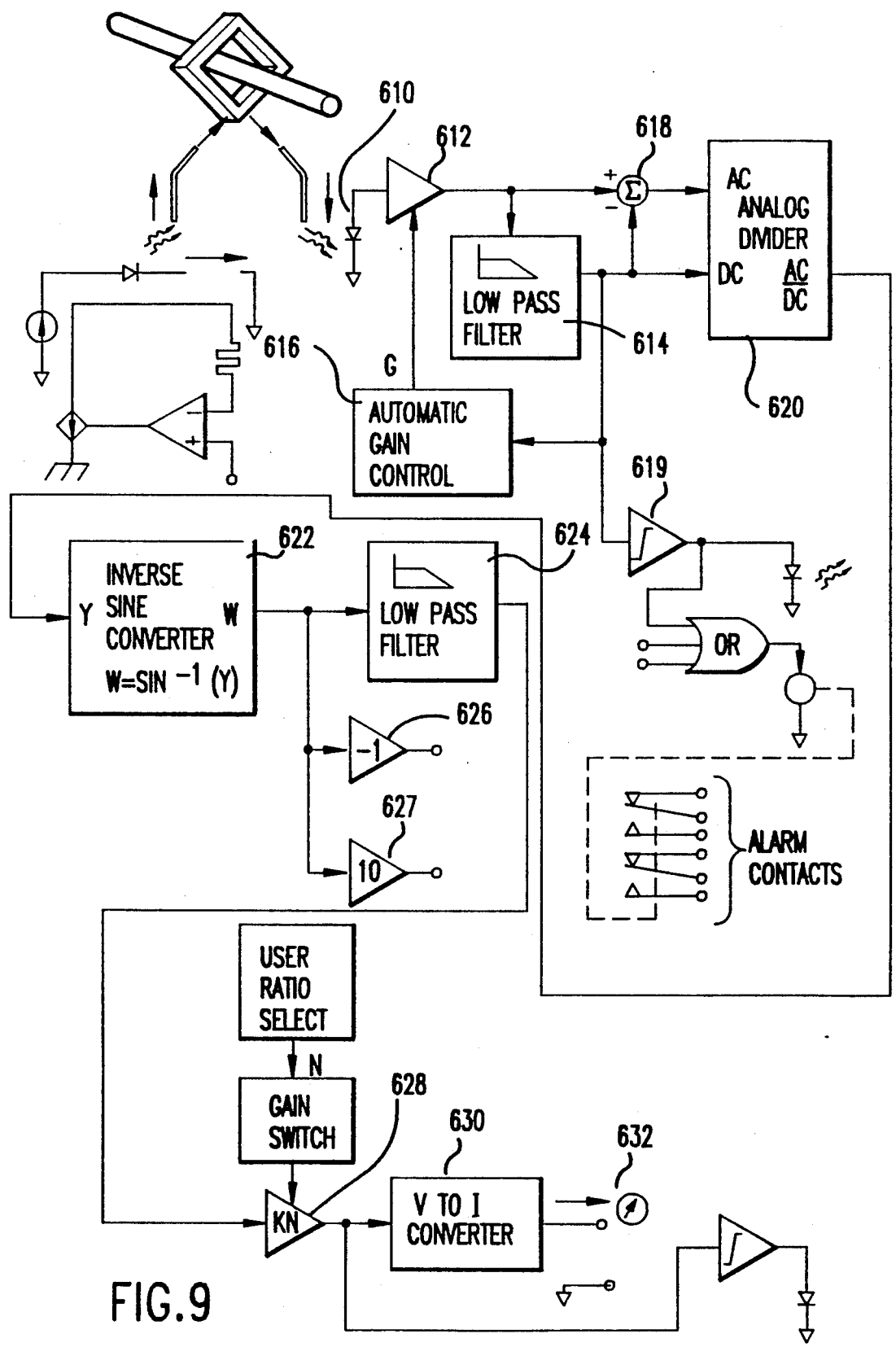
FIG. 9 is a block diagram of the electronic circuitry employed in the present invention.

The measuring circuitry, shown in block form in FIG. 9, is designed to provide a linear signal proportional to the current within the transmission line which passes through the OCT 10. Although Faraday rotation itself is a linear phenomenon, the use of an analyzing polarizer introduces a sine component on the output optical signal which must be removed.

Referring to the block diagram, FIG. 9, the optical signal is detected by a photodetector 610, which converts the optical signal to an electrical signal. Both the optical and electrical signal are of the form $So = (Si/2) 1 + sine(2\ theta)$ where So is the output signal, Si is the input signal, o equals uVI where u is the permeability of free space, V is the Verdet constant of the Faraday medium and I is the alternating current in the transmission line.

This composite signal is amplified in a variable amplifier which maintains a 5-Volt D.C. bias via a feedback loop. The feedback loop consists of a 10 Hz low pass filter 614, which removes the A.C. component of the signal. The D.C. component of the signal then passes through an automatic gain control 616. This control, coupled with the variable amplifier 612 ensures a constant 5-Volt D.C. bias even though, due to light intensity changes caused by changes in temperature or the quality of the optical fiber connections or some other reason, the D.C. component of the transducer signal is not constant. The signal then passes through a summing circuit 618 where the inverse of the D.C. component of the low pass filter 614 is added to the signal resulting in an output voltage of $V = (Si/2) Sine(2\ theta)$. At this point, there is also a window comparator (619) to check the signal level coming from the output surface 92.

The signal then enters an analog divider 620 which divides the input signal $(Si/2) Sine(2\ theta)$ by the D.C. component $(Si/2)$. This division operation results in an output of $M = Vac/Vdc = Sine (2\ theta)$.

The signal then enters an analog arcsine converter 622 whose purpose is to perform the inverse sine operation on the normalized signal thereby providing a functionally independent signal of the Faraday rotation angle theta. At this stage, a proportionality constant k in the form of an adjustable gain amplifier 621 yields a signal calibrated to the transducer 10 of 100mv/1000A. The output of the arcsine converter 622 is 2 theta divided by k which equals $(2uV/k)I$ passes through a 1 kHz low pass filter 624 which removes the noise residing in the higher harmonics of the signal. Prior to the 1 kHz filter additional outputs are provided. The outputs include a buffered output which contains a buffer amplifier 626 and an amplified test output 627 scaled to 1-Volt per 1000 amps in the transmission line. Following the 1 khz low pass filter 624 is an adjustable amplifier 628 whose gain is selected by the user. The gain selections of this amplifier correspond to the user's selection of the measurement ratios between the transmission line current and the output of the measuring circuitry providing a selection of readout scales. A final voltage to current converter 630 changes the output voltage signal of the electronics to an output current signal. The current signal then connects to the user's current meter 632.

Figure 10A:
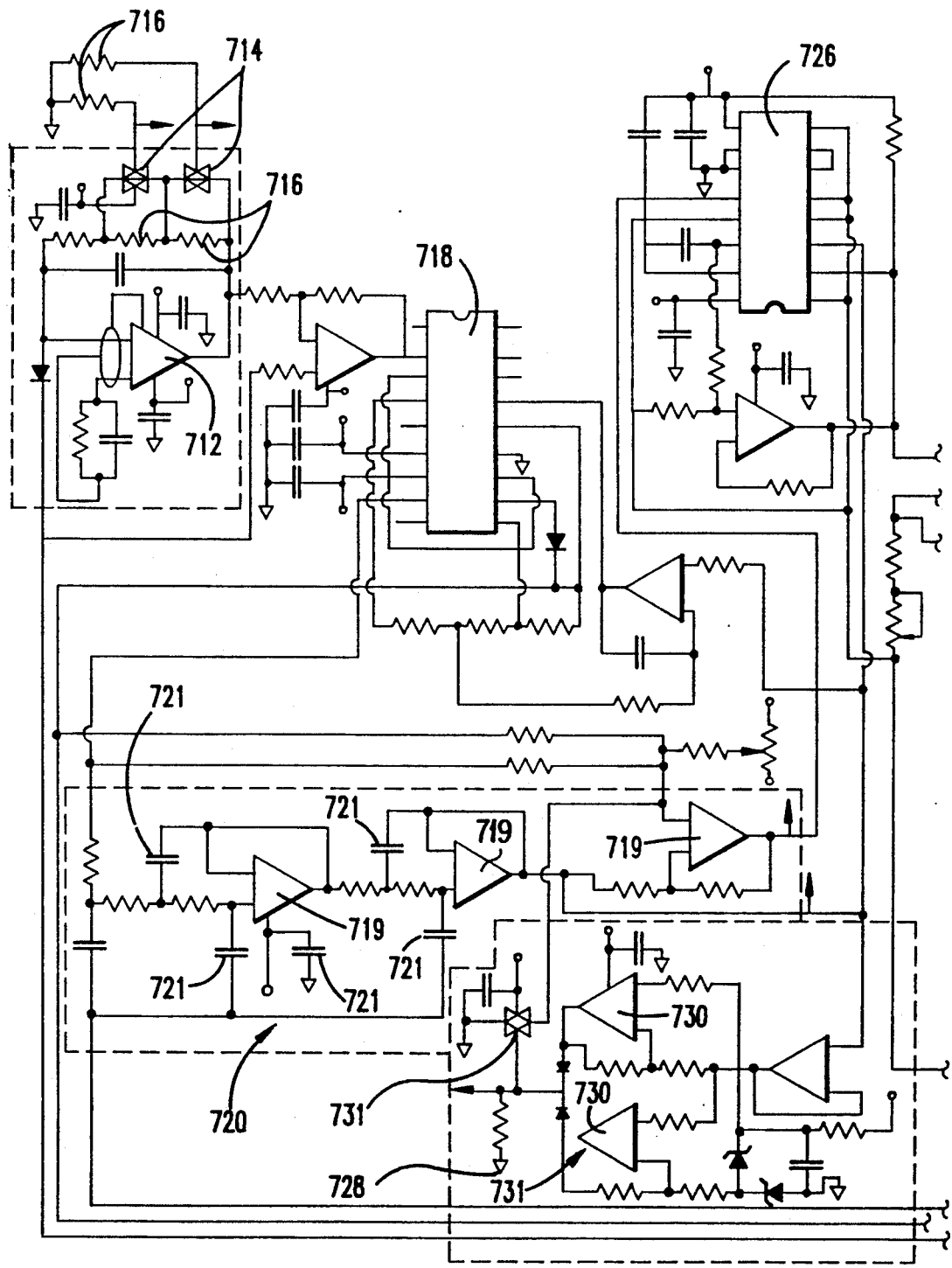
FIG. 10A and FIG. 10B is a schematic of the electronic circuitry employed to measure current in the present invention.
Figure 10B:
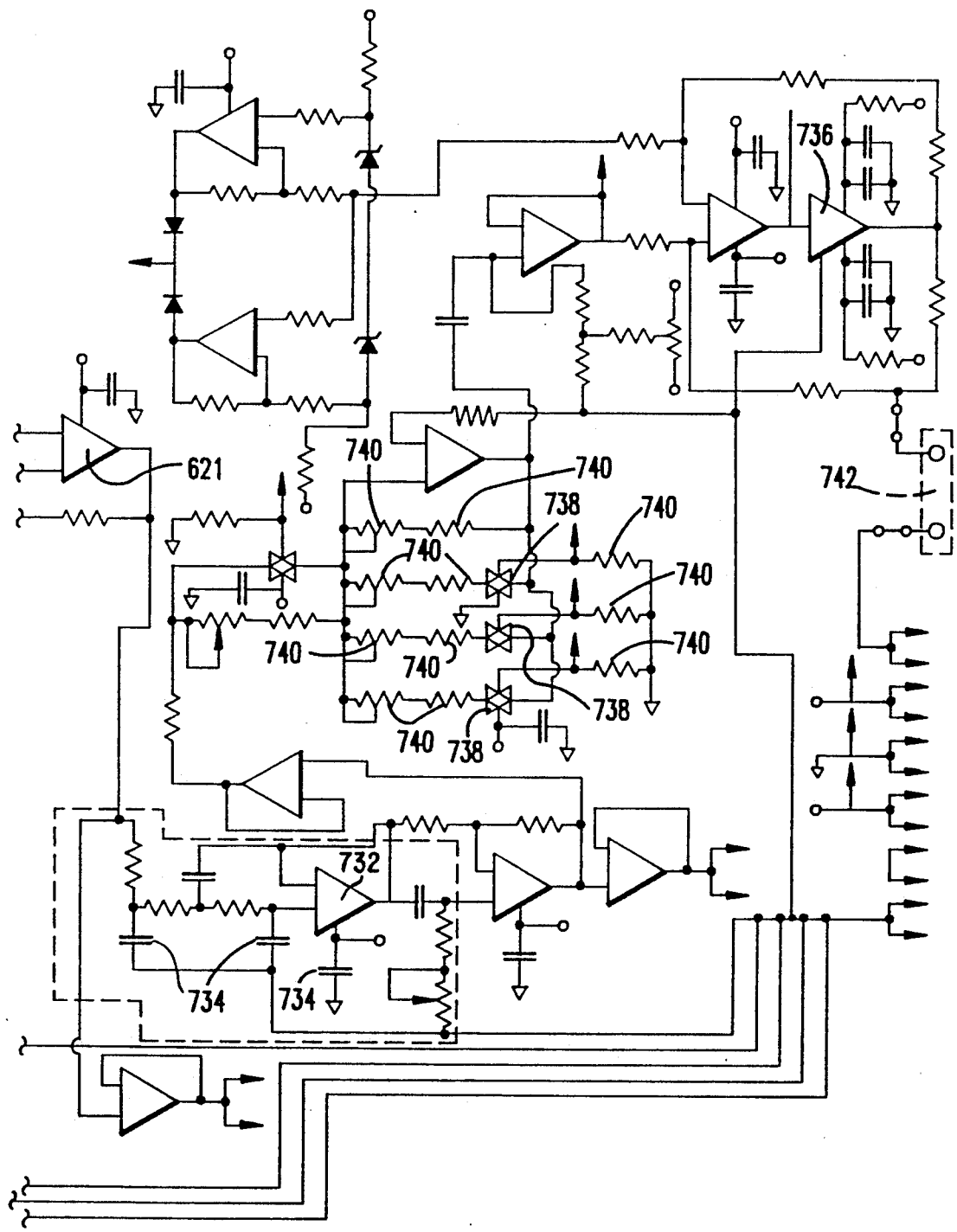

FIG. 10A/10B depict the schematic diagram of the measuring circuitry which was shown in block form in FIG. 9. An optical detector, which in the embodiment is a photodiode 710, provides the initial signal. This signal then enters a transconductance amplifier 712 which provides the primary gain of the photodiode 710 signal. The amplifier 712 is controlled by a manual coarse gain control 714 consisting of electronically switched resistive shunts 716 and an automatic fine gain control means. The automatic fine gain control means is controlled by an integrated circuit 718 where the preferred device is an Analog Device AD-538. The preferred integrated circuit 718 integrates the difference between the D.C. component of the transconductance amplifier signal $(S_I/2)$ and a 5-Volt D.C. set point. A filter 720 is used to provide the D.C. component of the transconductance amplifier signal. In the preferred embodiment, this filter 720 is a fifth order Chebyshev type, consisting of a set of summing amplifiers 719 coupled via capacitive shunts 721, passing a component below 10 Hz. The 10 Hz low pass filter 720 also provides the D.C. component to be divided out of the total signal $So = (Si/2) Sine(2\ theta)$ to the analog divider and arcsine convertor 726. In the preferred form, a single integrated circuit, such as Analog Devices AD-639, performs both the division and the inverse sine operation. The filter also sends the D.C. signal to a window comparator 728 which by means of a summing amplifier 730 and high and low voltage set points 731 can determine either the existence of an optics failure.

Upon exiting the divider and arcsine converter, the signal then passes through a third order 1 kHz low pass filter consisting of a summing amplifier 732 and a set of grounded capacitors 734 which remove the high frequency noise from the signal. The filter signal then enters a set of gain switches 738 connected to an array of resistors 740. Array 740 provides a user selected measurement sensitivity ratio signal. The sensitivity ratio signal is input is input to a voltage-to-current converter to provide a calibrated signal which is a magnitude signal proportional to the magnitude of the transmission line current. The converter function is principally performed by unity gain buffer amplifier 736. This calibrated signal is provided to a user at user metering output 742.

I claim:

1. A toroidal optical current transducer for measuring current in a conductor comprising:
   (a) a generally planar optical bench defining a bench orifice through which the current to be measured is passed in an electrical bench conductor, said bench having a first bench mounting surface 30, and a second bench mounting surface 32;
   (b) a light source supplying reference light of nominally predetermined intensity;
   (c) a polarizer having a first polarizing angle mounted on said optical bench receiving the reference light and transmitting a portion of said reference light as polarized light;
   (d) a first glass bar mounted on said optical bench, said bar having:
      (1) a light transmission axis along which light propagates and a bench surface mounted to one of the bench mounting surfaces,
      (2) an input end generally planar surface receiving polarized light from said polarizer, said input end surface oriented at an input angle to the transmission axis of approximately 90 degress, and
      (3) an output generally planar surface transmitting the polarized light to an associated component, said output end surface oriented at an output angle to the transmission axis of approximately 45 degrees;
   (e) a second glass bar mounted on said optical bench, said bar having:
      (1) a light transmission axis along which light propagates and a bench surface mounted to one of the bench mounting surfaces,
      (2) an input end generally planar surface receiving polarized light from an associated component, said input end surface oriented at an input angle to the transmission axis of approximately 45 degrees, and
      (3) an output end generally planar surface transmitting the polarized light to an associated component, said output end surface oriented at an output angle to the transmission axis of approximately 45 degrees;
   (f) a third glass bar mounted said optical bench, said bar having:
      (1) a light transmission axis along which light propagates and a bench surface mounted to one of the bench mounting surfaces,
      (2) an input end generally planar surface receiving polarized light from an associated component, said input end surface oriented at an input angle to the transmission axis of approximately 45 degrees, and
      (3) an output end generally planar surface transmitting the polarized light to an associated component, said output end surface oriented at an ouput angle to the transmission axis of approximately 45 degrees;
   (g) a fourth glass bar mounted on said optical bench, said bar having:
      (1) a light transmission axis along which light propagates and a bench surface mounted to one of the bench mounting surfaces.
      (2) an input end generally planar surface receiving polarized light from an associated component, said input end surface oriented at an input angle to the transmission axis of approximately 45 degrees, and
      (3) an output end generally planar surface transmitting the polarized light to an associated component, said output end surface oriented at an output angle to the transmission axis of approximately 45 degrees;
   (h) said bars prestressed to provide two stress axes, said axes orthogonal to each other and to the transmission axis;
   (i) said bars surrounding the bench orifice, and optically coupled to each other by having an input end surface adjoining the output end of an adjoining bar;
   (j) said bars mounted to said bench in a manner preserving their optical alignment while damping any vibrational coupling between said bench and said bars;
   (k) an analyzer having a second polarizing angle mounted on said optical bench receiving the light transmitted from the fourth bar, said second polarizing angle being displaced from said first polarizing angle by about 45 degrees, said analyzer transmitting a single analyzer light beam; and
   (l) a light activated device receiving said analyzer light beam and producing a current proportionate to the resulting Faraday rotation of the polarized light as a result of the magnetic field produced by the current to be measured.

2. The transducer of claim 1 further including:
   an input collimating lens interposed between said light source and said polarizer, said input lens mounted on said bench to focus the reference light on said polarizer; and
   an output collimating lens interposed between said analyzer and said light activated device, said output lens mounted on said bench to focus the polarized light for reception by said light activated device.

3. The transducer of claim 1 wherein:
   said light source and said light activated device are remotely mounted from said optical bench, and further including
   an input light fibre transmitting reference light from said light source to said input collimating lens; and
   an output light fibre transmitting said polarized light from said output collimating lens to said light activated device.

4. The transducer of claim 1 wherein:
   said first and third bars are mounted to said first bench mounting surface; and
   said second and fourth bars are mounted to said second bench mounting surface.

5. The transducer of claim 4 wherein said mounting of said bars to said bench consists of:
   (a) a flexible cured bonding material to adhere said bars to said optical bench; and
   (b) a plurality of BALINTINA SPHERES dispersed throughout said bonding material.

6. The transducer of claim 3 further including:
   an input assembly operatively optically coupling said input fibre, input lens and said polarizer in a rigid manner, said input assembly mounted to said first surface by the mounting media,
   a flexible cured bonding material to adhere said bars to said optical bench; and
   a plurality of BALINTINA SPHERES dispersed throughout said bonding material.

7. The transducer of claim 4 wherein:
(a) said bench has a semi-octagonal shape including bench parallel sides, and bench corner sides;
(b) said bars positioned with their first side surfaces parallel to said bench corner sides and for a portion of their length inward of said bench parallel sides, and with their end surfaces projecting beyond said bench corner sides.

8. The transducer of claim 5 wherein:
said mounting media is applied to localized media locations of said bar bench mounting surface to minimize stress on said bars from the adhesion between said bars and said bench.

9. The transducer of claim 6 wherein:
said media locations are toward each end of said bars one to one side of the transmission axis, and near the middle of said bars to a second opposite side of said transmission axis.

10. The transducer of claim 1 wherein:
each bar has a fast and a slow axis, the fast and slow axis being orthogonal to each other and to said transmission axis, the fast and slow axes of adjoining bars preserving the same handedness between adjoining bars,
whereby the s and p vectors associated with the polarized E vector are first interchanged by reflection from said output surface, and second interchanged by reflection from said input surface, with the result that birefringence effects tend to be cancelled because the association between the s and p vectors and the fast and slow axes in one bar is reversed in the adjoining bar.

11. The transducer of claim 1 wherein
said bench conductor is associated with a bench conductor assembly to preserve the location and orientation of said current fields with respect to said optical bars.

12. The transducer of claim 1 wherein said first through fourth bars are rate annealed to relieve internal glass stress.

13. The transducer of claim 1 further including:
a hermetic tank surrounding said transducer and isolating said transducer from the environment in which said transducer is located;
an input feed thru conductor connected to a first end of said bench conductor; and
an output feed thru conductor connected to a second end of said bench conductor; and wherein
said bench conductor includes a plurality of cables within a bench insulative pipe.

14. The transducer of claim 1 further including
a temperature controller operatively interconnected with said light source to maintain said light source at a predetermined temperature.

15. The transducer of claim 14 further including
(a) a constant current source activating said light source, whereby said light source generates light of a predetermined intensity and predetermined wavelength.

16. The transducer of claim 14 further including
a standardizing circuit which applies a predetermined scaling factor to said magnitude signal.

* * * * *